United States Patent
Luo et al.

(10) Patent No.: US 8,120,075 B1
(45) Date of Patent: Feb. 21, 2012

(54) SEMICONDUCTOR DEVICE WITH IMPROVED TRENCHES

(75) Inventors: Yuhao Luo, San Jose, CA (US); Deepak Kumar Nayak, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/940,364

(22) Filed: Nov. 5, 2010

Related U.S. Application Data (62) Division of application No. 11/983,551, filed on Nov. 9, 2007, now Pat. No. 7,851,313.

(51) Int. Cl.
  *H01L 29/80* (2006.01)
  *H01L 21/336* (2006.01)

(52) U.S. Cl. ... 257/288; 257/19; 257/615; 257/E21.223; 257/E21.335; 257/E23.431; 438/259; 438/270; 438/285; 438/700

(58) Field of Classification Search .......... 257/19, 257/288, 615, E21.223, E21.335, E21.431; 438/259, 270, 285, 700
See application file for complete search history.

(56) References Cited

U.S. PATENT DOCUMENTS

| | | | |
|---|---|---|---|
| 6,368,921 B1 | 4/2002 | Hijzen et al. | |
| 6,946,350 B2 * | 9/2005 | Lindert et al. | 438/285 |
| 7,045,407 B2 | 5/2006 | Keating et al. | |
| 7,560,758 B2 * | 7/2009 | Zhu et al. | 257/288 |
| 7,586,158 B2 * | 9/2009 | Hierlemann et al. | 257/369 |

OTHER PUBLICATIONS

U.S. Appl. No. 11/983,551 filed Nov. 9, 2007, Luo et al.

Chidambaram P. R. et al., "35% Drive Current Improvement from Recessed-SiGe Drain Extensions on 37 nm Gate Length PMOS," *2004 Symposium on VLSI Digest of Technical Papers*, Jun. 15, 2004, pp. 48-49, IEEE, Piscataway, New Jersey, USA.

Chipworks, *Intel D920 (Presler 65 nm node) 2.9 GHz Dual Core Microprocessor Structural Analysis Report*, Feb. 17, 2006, pp. 1-141, Chipworks, Ottawa, Ontario, Canada.

Chipworks, *Intel Xeon E5410 Microprocessor (Codename Harpertown, Penryn Die Markings) Intel 45 nm High-k + Metal Gate CMOS Process Structural Analysis*, Dec. 7, 2007, pp. 1-254, Chipworks, Ottawa, Ontario, Canada.

Ghani, T. et al., "A 90nm High Volume Manufacturing Logic Technology Featuring Novel 45nm Gate Length Strained Silicon CMOS Transistors," *IEDM '03 Technical Digest*, 2003 IEEE International Electron Devices Meeting, Dec. 8, 2003, pp. 11.6.1 to 11.6.3, IEEE, Piscataway, New Jersey, USA.

* cited by examiner

*Primary Examiner* — Dao H Nguyen
(74) *Attorney, Agent, or Firm* — Michael T. Wallace; John J. King; Thomas George (57) ABSTRACT

A semiconductor device exhibiting enhanced carrier mobility within a channel region of the semiconductor device is disclosed. The semiconductor device includes a gate stack having first and second sidewall spacers, where the gate stack is implemented above the channel region of the semiconductor device. The semiconductor device further includes first and second trenches formed adjacent to the gate stack, where the first and second trenches are conically shaped to be wider at a top portion of each trench as compared to a width of each trench below the top portion of each trench. The semiconductor device further includes strained silicon alloy formed within the first and second trenches, where a stress force exerted on the channel region of the semiconductor device is maximized at a surface of the semiconductor device below the gate stack.

18 Claims, 6 Drawing Sheets

SEMICONDUCTOR DEVICE WITH IMPROVED TRENCHES

CROSS-REFERENCE TO RELATED APPLICATIONS

This application is a divisional of U.S. patent application having the application Ser. No. 11/983,551 filed on Nov. 9, 2007 and titled "Semiconductor Device and Process for Improved Etch Control of Strained Silicon Alloy Trenches" by Yuhao Luo and Deepak Kumar Nayak.

FIELD OF THE INVENTION

An embodiment of the present invention generally relates to advanced semiconductor processing, and more particularly, to a process for improved etch control of strained silicon trenches.

BACKGROUND OF THE INVENTION

Advances in the field of semiconductor integrated circuits have brought about higher levels of integration. Accordingly, semiconductor manufacturing process advancements are driving the corresponding geometric dimensions of semiconductor devices to decreasingly smaller values. 10 micrometer (μm) gate lengths, for example, were common in the 1970's, but continuously advancing semiconductor manufacturing processes have reduced gate lengths to well below 100 nanometers (nm).

Conventional scaling of transistor geometries, however, will soon become insufficient to continue device performance advancements through the creation of smaller transistors. Thus, alternatives to device scaling are being developed, where in one alternative, the formation of ultra-thin gate structures are used to control capacitance. Other alternatives to device scaling include stress engineering, whereby carrier mobility increases within the channel of a field effect transistor (FET) are realized through the introduction of mechanical stresses that are imposed upon the channel.

In particular, a compressive stress imposed upon the channel of a p-type FET (PFET) has been shown to increase the mobility of holes within the channel of the PFET. Similarly, a tensile stress imposed upon the channel of an n-type FET (NFET) has been shown to increase the mobility of electrons within the channel of the NFET.

A conventional technique to introduce compressive, or tensile, stress within the channel of a FET is to provide structures on either side of the channel that either compress, or stretch, the channel after formation. In particular, recesses are etched into a layer of silicon on either side of a previously formed gate stack. Source and drain films are then formed within each recess, where the films may be comprised of a silicon-germanium (SiGe) alloy for PFET devices, or a silicon-carbide (SiC) alloy for NFET devices.

Since the films are epitaxially formed within the recesses, each film exhibits the same crystal lattice structure as the crystal lattice structure of the underlying silicon. However, due to the inclusion of the SiGe alloy in the PFET devices, each atom in the alloy lattice exhibits a larger separation distance as compared to the separation distance of each atom of the underlying silicon lattice. As such, a compressive stress is exerted on the channel region of the PFET between each source and drain recess, which has been shown to increase the mobility of holes within the PFET channel during the conductive state of the PFET.

Alternately, inclusion of the SiC alloy in the NFET devices causes each atom in the alloy lattice to exhibit a smaller separation distance as compared to the separation distance of each atom of the underlying silicon lattice. As such, a tensile stress is exerted on the channel region of the NFET between each source and drain recess, which has been shown to increase the mobility of electrons within the NFET channel during the conductive state of the NFET.

Conventional semiconductor processing techniques, however, tend to create adverse effects during the formation of the source and drain recesses. In particular, isotropic etchants are typically used to form the source and drain recesses where the SiGe and SiC films are formed. However, since the etchants are isotropic, the shape and undercut of the trench is controlled only by the amount of time that the source and drain regions are exposed to the etchant. Additionally, gate oxide damage and encroachment of the etchant into the silicon beneath the channel region may cause undercut during the etching process, which adversely affects the performance of the device.

Efforts continue, therefore, to identify semiconductor etching processes that provide selective etching so as to better control the shape and depth of trenches formed within the semiconductor material.

SUMMARY OF THE INVENTION

To overcome limitations in the prior art, and to overcome other limitations that will become apparent upon reading and understanding the present specification, various embodiments of the present invention disclose a semiconductor process for improved control of the shape and depth of trenches formed within the semiconductor material.

In accordance with one embodiment of the invention, a method of forming strained silicon alloy trenches within a semiconductor substrate comprises forming sidewall spacers on a gate stack of the semiconductor substrate, exposing a photoresist layer of the semiconductor substrate to a mask pattern, etching the photoresist layer and underlying semiconductor substrate in accordance with the mask pattern to form trenches within the semiconductor substrate. The trenches are selectively etched to produce a slower etch rate along a first crystallographic direction relative to an etch rate along second and third crystallographic directions. The method further comprises aligning the trenches to the sidewall spacers to minimize a separation distance between the trenches and the gate stack.

In accordance with another embodiment of the invention, a method of forming trenches within a semiconductor substrate comprises forming sidewall spacers on a gate stack of the semiconductor substrate, forming lightly doped drain regions within the semiconductor substrate adjacent to the gate stack, driving one edge of each lightly doped drain region under the gate stack to form first and second lightly doped drain portions under the gate stack, removing portions of each lightly doped drain region until only the first and second lightly doped drain portions of the lightly doped drain regions remain, exposing a photoresist layer of the semiconductor substrate to a mask pattern, etching the photoresist layer and underlying semiconductor substrate in accordance with the mask pattern to form trenches within the semiconductor substrate. The trenches are selectively etched to produce a slower etch rate along a first crystallographic direction relative to an etch rate along second and third crystallographic directions. The method further comprising aligning the trenches to the first and second lightly doped drain portions to form the trenches below a surface of the semiconductor substrate.

In accordance with another embodiment of the invention, a semiconductor device exhibiting enhanced carrier mobility within a channel region of the semiconductor device. The semiconductor device comprising a gate stack having first and second sidewall spacers, the gate stack being implemented above the channel region of the semiconductor device. The semiconductor device further comprising first and second trenches formed adjacent to the gate stack, the first and second trenches being conically shaped to be wider at a top portion of each trench as compared to a width of each trench below the top portion of each trench. The semiconductor device further comprising strained silicon alloy formed within the first and second trenches. A stress force is exerted on the channel region of the semiconductor device, the stress force being maximized at a surface of the semiconductor device below the gate stack.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention provide a process in which an anisotropic selective wet etch is used to better control the shape and depth of trenches formed within a semiconductor substrate. The etchants described herein exhibit preferential etching along two of the crystallographic directions, but exhibit an etch rate that is much slower in a third crystallographic direction. As such, one dimension of the etching process is time controlled, a second dimension of the etching process is self-aligned using oxide spacers, and a third dimension of the etching process is inherently controlled by the selective etch phenomenon of the selective etchant along the third crystallographic direction.

In one embodiment, the selective wet etchants may be utilized to form precisely shaped trenches within the source and drain regions of a field effect transistor (FET). Alloy films may then be epitaxially formed within the trenches to create compressive, or tensile, stress within the channel region of the FET.

Sidewall spacers are utilized on the gate stack of the FET to act as an etch stop to the selective wet etchants. In particular, $SiO_2$ or $Si_3N_4$ may be used along the sidewall of the gate stack, which causes the trench to be self-aligned with the sidewall spacers. As such, the distance between the source/drain trench and the channel region at the semiconductor substrate surface is equal to the thickness of the sidewall spacer. In addition, since the thickness of the sidewall spacers may be well controlled and minimized down to, e.g., 5 angstroms, the distance between the source/drain trench and the channel region is also well controlled and minimized to, e.g., 5 angstroms. Minimization of the distance between the source/drain trench and the channel region maximizes the amount of stress imposed upon the channel region at the surface of the semiconductor substrate.

The selective wet etchants discussed herein exhibit preferential etching along two crystallographic directions, while exhibiting a much slower etch rate along a third crystallographic direction. As such, trench etching may be directed away from the channel region, such that the resultant trench exhibits close proximity to the channel at the surface of the silicon substrate, while exhibiting increased separation from the channel as the trench falls below the surface of the silicon substrate. The resulting conically shaped trench, therefore, maximizes compressive, or tensile, stress at or near the surface of the semiconductor substrate, e.g., within 3 to 5 nanometers of the surface of the semiconductor substrate. As such, carrier mobility enhancements within the channel that are derived from the conically shaped trench are maximized because the majority of channel current is conducted within a region where the compressive, or tensile, stress is maximized.

In addition, directing the trench etch away from the channel prevents damage to the silicon and gate oxide layers that exist underneath the gate stack. Still further, the selective etchants used to form the trench shape create nearly perfect crystal surfaces along each of three crystallographic planes, so as to promote defect-free epitaxial alloy formation within each trench formed. The selective etch properties of the wet etchants discussed herein also form trenches having well controlled shapes and depths. As such, the alloy films formed within the trench also exhibit well controlled shapes and depths, which promotes a well controlled stress profile within the channel region.

In one embodiment, a silicon-germanium (SiGe) alloy may be epitaxially grown within source and drain trenches of a p-type FET (PFET), so as to impose a well controlled compressive stress profile within the channel region of the PFET. In an alternate embodiment, a silicon carbide (SiC) alloy may be epitaxially grown within source and drain trenches of an n-type FET (NFET), so as to impose a well controlled tensile stress profile within the channel region of the NFET.

In alternate embodiments, a deeper trench may be implemented within the semiconductor structure by first forming a lightly doped drain (LDD) region within the source and drain regions of the device. An annealing step drives the LDD region under the gate stack, which then serves as an etch stop in subsequent processing steps. By utilizing both the sidewall spacers of the gate stack and the LDD region under the gate stack, a deeper trench is implemented within the semiconductor structure after the selective wet etch is implemented.

Figure 1:
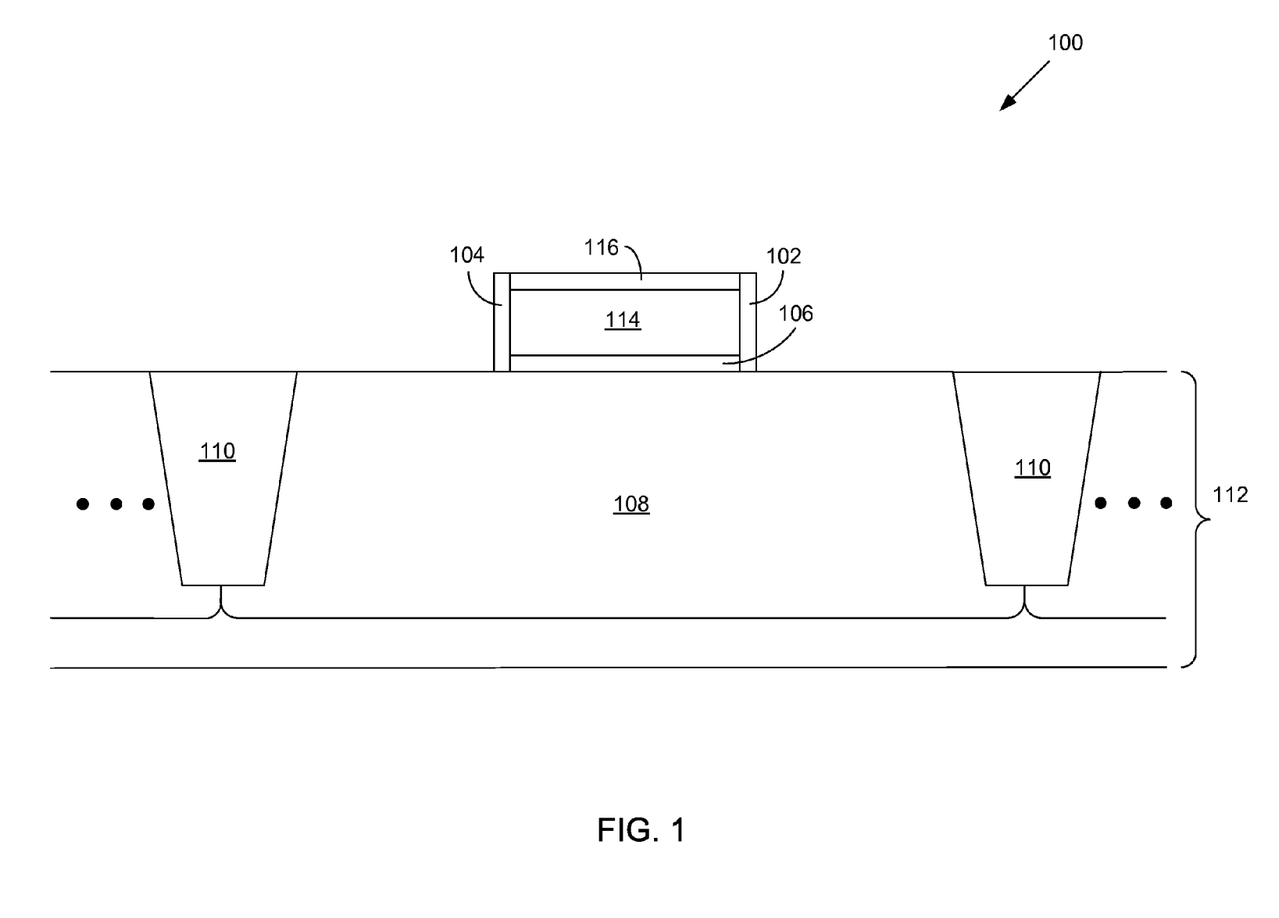
FIG. 1 exemplifies a semiconductor structure that may be used as a starting material to facilitate formation of structures that impose mechanical stress upon the channel region.

Turning to FIG. 1, exemplary semiconductor structure 100 is illustrated, which may be used as a starting material to begin the preparation of a final semiconductor structure that imposes mechanical stress into the channel region of a semiconductor device to improve carrier mobility within the channel region. Semiconductor substrate 112, hereinafter referred to as substrate 112, is formed of a semiconductor material, such as a single-crystal silicon or germanium, which serves as a base platform for the implementation of semiconductor devices. Well region 108, for example, is typically formed within substrate 112 by introducing well dopants into a diffusion region of substrate 112 whose dimensions may be defined by a microlithographic process. Well region 108 may be formed as a diffused-well structure, in which a shallow ion implant process followed by a high temperature diffusion step drives well region 108 deep into substrate 112. Alternately, well region 108 may be formed as a retrograde-well structure, in which a high-energy ion implant process creates a deep implant peak within substrate 112 without the need to implement a high-temperature diffusion step.

Well region 108 may be doped with n-type, or p-type, dopants depending upon the conductivity type that is required by the device that is ultimately formed within substrate 112. If an n-type FET (NFET) is required, for example, then well region 108 represents a p-well region that is to be formed using p-type dopants. If, on the other hand, a p-type FET (PFET) is required, then well region 108 represents an n-well region that is to be formed using n-type dopants.

The gate stack structure of semiconductor structure 100, in embodiments exemplified in FIG. 1, may include polycrystalline silicon (polysilicon) portion 114. Polysilicon portion 114 creates a conductive property for the gate, such that the gate stack may also be used as an interconnect. However, should the length of the gate stack be reduced below a certain minimum length, such as 1.25 μm, the resistance of the gate stack becomes too large to be effective as an interconnect. Metal silicide layer 116 may, therefore, be used to clad the surface of polysilicon portion 114 to form a so-called "polycide structure". Use of the polycide structure to form the gate stack reduces the resistance of the gate stack to facilitate its use as an interconnect. In alternate embodiments, gate portion 114 may be implemented using a metallic element, such as tungsten, so as to further reduce the resistance of the gate stack. In such an instance, the need for metal silicide layer 116 is obviated.

Gate oxide layer 106 exists between gate portion 114 and well region 108 to form the gate dielectric, or insulator, between well region 108 and gate portion 114. Gate oxide layer 106 is generally fabricated with a thermally grown layer of silicon dioxide, whose thickness has historically been scaled to linearly track the scaling of the length of the gate stack.

Sidewall spacers 102, 104 are used in a subsequent processing step to align device features along the edge of the gate stack as discussed in more detail below. Sidewall spacers 102, 104 may be formed by a chemical vapor deposition (CVD) of a dielectric film, such as $SiO_2$ (silicon dioxide) or $Si_3N_4$ (silicon nitride), which is then followed by an anisotropic etch step.

Shallow trench isolation (STI) structures 110 may be formed within substrate 112 so as to isolate semiconductor structure 100 from other devices (not shown) that may be formed within substrate 112. STI structures 110 are formed by first etching a relatively shallow trench, e.g., 0.1-0.5 μm, into substrate 112. Next, a short thermal oxidation growth step is used to grow a film of $SiO_2$ inside the trench. The trench is then filled with an insulator material, such as $SiO_2$, where the thermally grown $SiO_2$ film is used to control the interface between the Si of substrate 112 and the $SiO_2$ insulative material that is used to form STI structures 110.

Figure 2A:
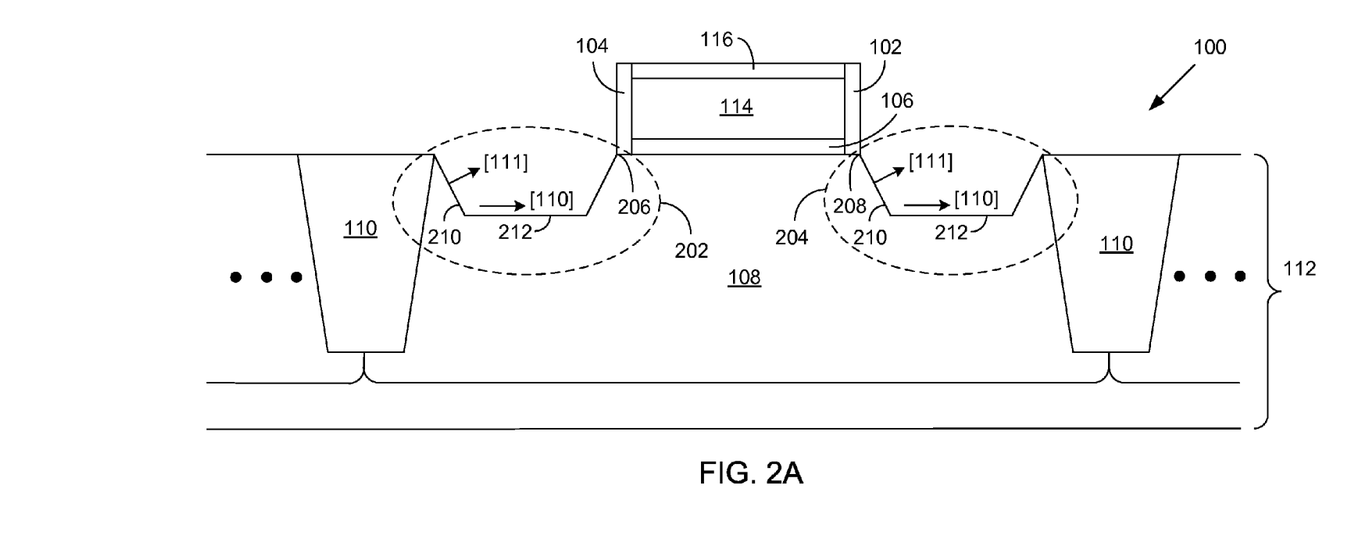
FIG. 2A illustrates the semiconductor structure of FIG. 1 after selective wet etching.

Turning to FIG. 2A, additional processing steps and associated structure changes are described, whereby trench regions 202, 204 are formed within semiconductor structure 100 of FIG. 1. Trenches 202, 204 are ultimately utilized to accommodate epitaxially grown alloys that exhibit the same lattice structure as the underlying substrate, while exhibiting different atom spacing.

Epitaxially grown SiGe, for example, as may be used within trenches 202, 204, exhibits the same lattice structure as the lattice structure of the underlying Si within well region 108. However, since the atom spacing within the SiGe lattice is larger than the atom spacing within the Si lattice, a compressive force is exerted on the channel region immediately below the gate stack. Epitaxially grown SiC, on the other hand, as may be used within trenches 202, 204, exhibits the same lattice structure as the lattice structure of the underlying Si within well region 108. However, since the atom spacing within the SiC lattice is smaller than the atom spacing within the Si lattice, a tensile force is exerted on the channel region immediately below the gate stack.

After formation of sidewall spacers 102 and 104, as discussed above in relation to FIG. 1, formation of trenches 202 and 204 may commence. In particular, the area where trenches 202 and 204 are to be formed may be defined by a microlithographic exposure process, whereby photoresist deposited on the top surface of substrate 112 is exposed to geometric patterns of radiation, such as ultraviolet (UV) light, whereby the exposed areas are defined by an exposure tool, photomask, and/or computer data. After exposure, the photoresist is subjected to a development process that converts the latent image in the photoresist into the final image, which ultimately serves as the mask in the subsequent etching process to selectively remove material from substrate 112 to produce trenches 202 and 204.

In particular, the etching process is performed using anisotropic silicon etchants that exhibit preferential etching along certain crystallographic directions, while exhibiting much slower etch rates along other crystallographic directions. For example, potassium hydroxide (POH), ethylene diamine pyrocatechol (EDP), and tetramethyl ammonium hydroxide (TMAH) exhibit preferential etching characteristics along the <100> and <110> crystallographic directions. The etch rate along the <111> crystallographic direction, however, that is achieved by the anisotropic etchants POH, EDP, and TMAH, is orders of magnitude slower as compared to the etch rate along the <100> and <110> crystallographic directions.

Figure 2B:
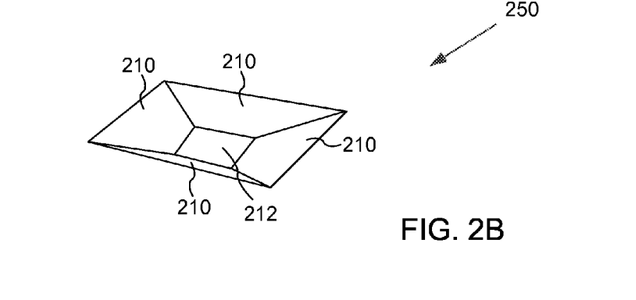
FIG. 2B illustrates a three-dimensional view of trenches formed within the semiconductor structure of FIG. 2A.

As such, a conically shaped trench as exemplified by trench 250 of FIG. 2B may be formed that exhibits the well controlled depth and shape as illustrated. In particular, the etch rate along the <111> crystallographic direction is orders of magnitude slower in relation to the etch rates along the <100> and <110> crystallographic directions. Thus, sidewalls 210 of trench 250 are formed at approximately 54° with respect to the surface of substrate 112 along the <110> crystallographic direction due to the selective etch phenomenon of the etchant along the <111> crystallographic direction. The surface area of floor 212 of trench 250 is time controlled in accordance with the etch rate along the <111> crystallographic direction.

As discussed above, the conical shape of trench 250 provides for a minimum separation distance between trenches 202, 204 and the channel region at the surface of the substrate. As such, once the epitaxially grown alloys are formed within trenches 202, 204, a stress profile may be imposed within the channel region, such that compressive, or tensile, stress is maximized at or near the surface of the substrate, which also maximizes carrier mobility at or near the surface of the substrate.

Trenches 202 and 204 are self-aligned between STI structures 110 and sidewall spacers 104 and 102, respectively. That is to say, in other words, that the material forming sidewall spacers 102 and 104 is virtually non-reactive to the anisotropic etchants POH, EDP, and TMAH. As such, trench 202 is self-aligned to sidewall spacer 104 at position 206, while trench 204 is self-aligned to sidewall spacer 102 at position 208. It can be seen, therefore, that by adjusting the width of sidewall spacers 102 and 104, the distances between trenches 204 and 202, respectively, and the channel of semiconductor structure 100 may be well controlled. The diametrically opposing sidewalls of trenches 202 and 204 are similarly self-aligned to STI structures 110 for the same reasons.

Figure 3:
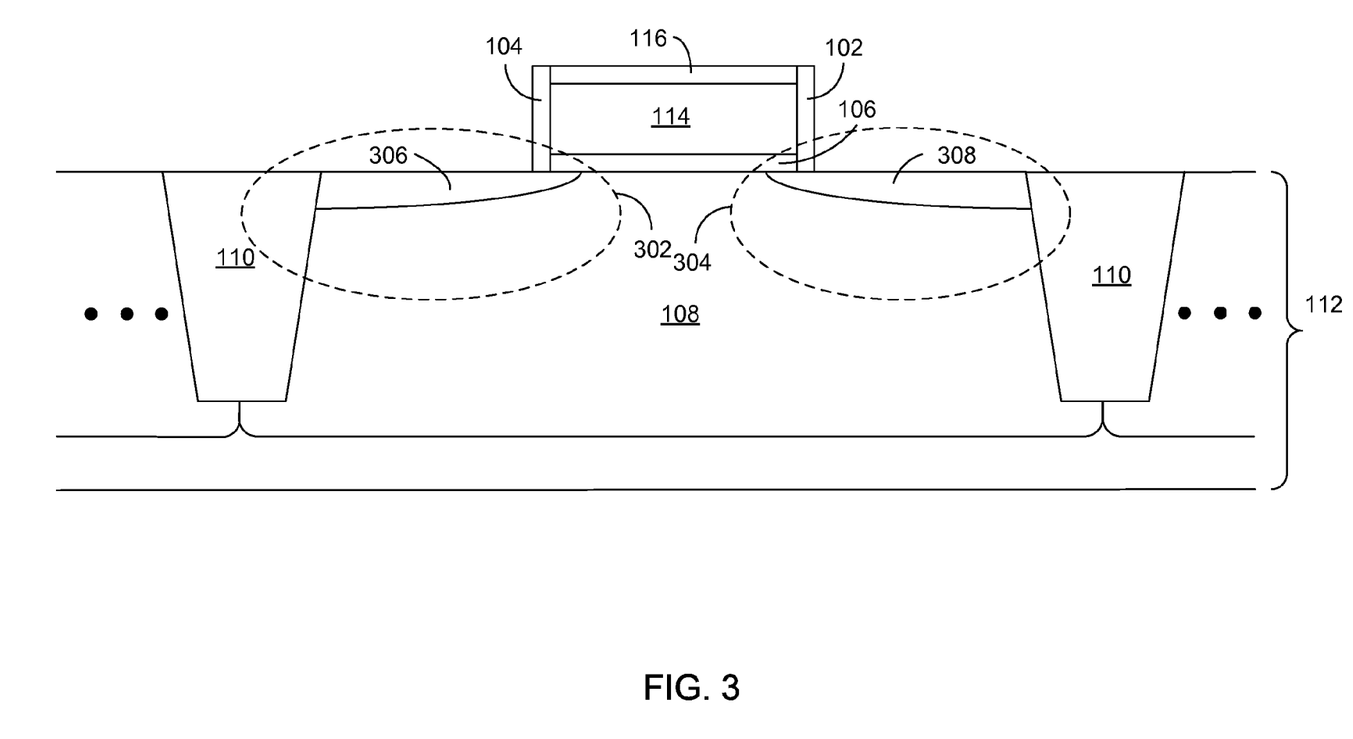
FIG. 3 illustrates an alternate semiconductor structure having lightly doped drain regions formed prior to selective wet etching.
Figure 4:
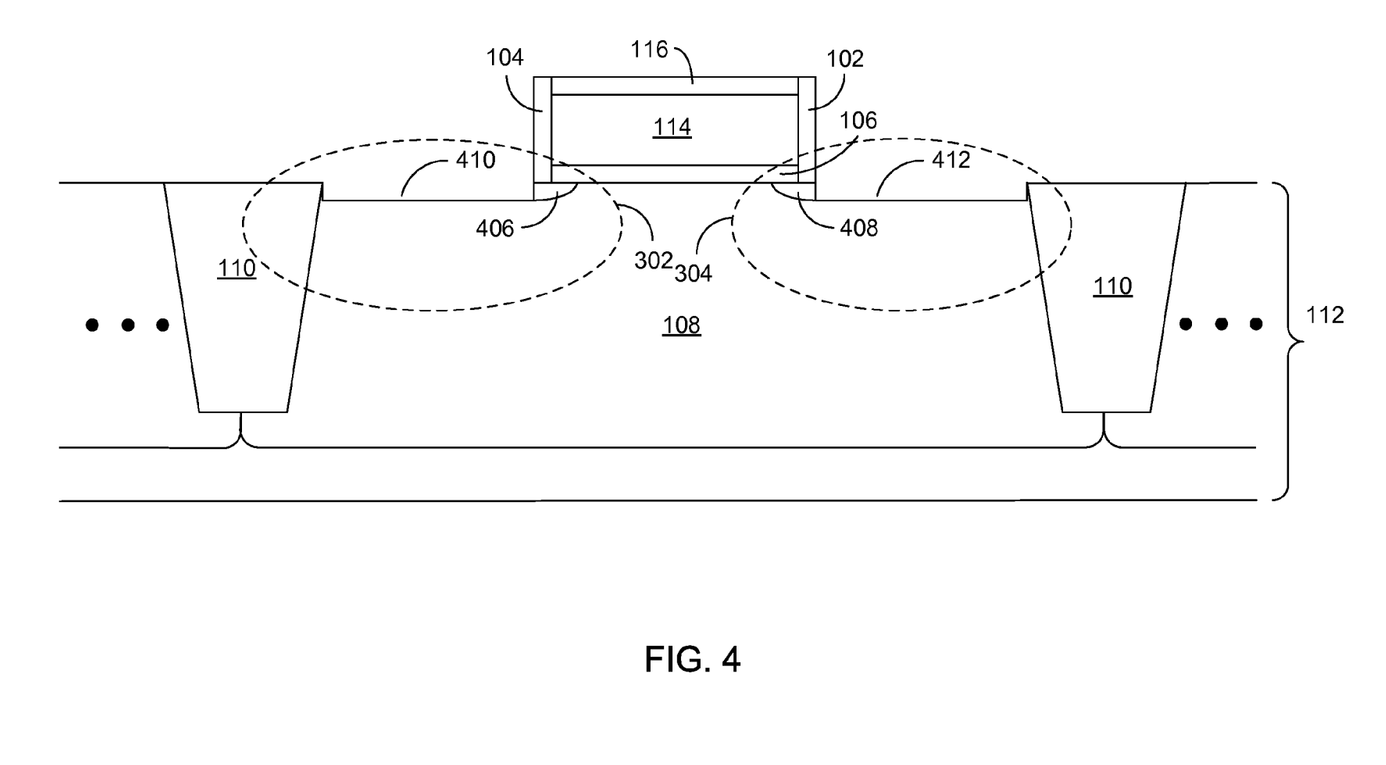
FIG. 4 illustrates the semiconductor structure of FIG. 3 after shallow trenching.
Figure 5:
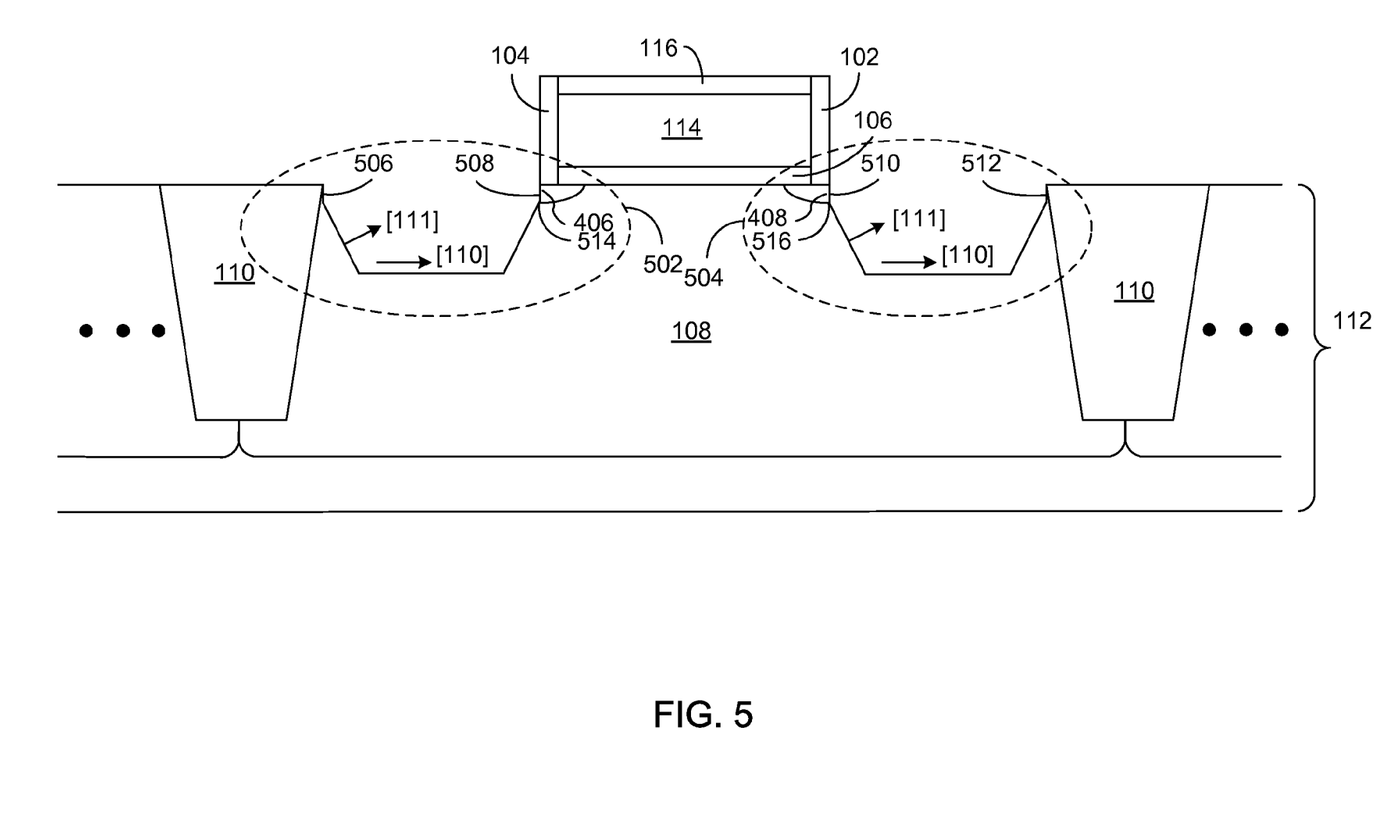
FIG. 5 illustrates the semiconductor structure of FIG. 4 after selective wet etching.

Turning to FIGS. 3-5, alternate processing steps and associated structure changes are exemplified, whereby deeper trenches are formed within the semiconductor structures as compared to the depth of trenches 202 and 204 of FIG. 2. After the starting material as exemplified in FIG. 1 is formed, a first processing step, as exemplified in FIG. 3, forms lightly doped drain (LDD) regions 306 and 308 within trench regions 302 and 304, respectively. In particular, after the gate stack is patterned, LDD regions 306 and 308 are formed by implanting doping atoms using an ion implantation step using, e.g., a medium-current boron implanter, whereby spacers 102 and 104 align the LDD regions to each edge of the gate stack. Next, an anneal step activates the LDD regions and drives the edges of LDD regions 306 and 308 to a proper distance under the gate stack as illustrated.

Turning to FIG. 4, an additional microlithographic process defines shallow trenches 410 and 412, whereby additional photoresist/exposure/dry etch steps are performed to remove a portion of LDD regions 306 and 308. In particular, shallow trenches 410 and 412 are formed through a dry etch step, so as to remove portions of LDD regions 306 and 308 that exist within the source/drain regions of the semiconductor structure. The remaining LDD portions 406 and 408 are implemented under the gate stack and are the only remaining LDD portions that exist after the dry etch step.

Turning to FIG. 5, an additional embodiment of an etching process, similar to the etching process as discussed above in relation to FIG. 2, is performed using anisotropic silicon etchants that exhibit preferential etching along certain crystallographic directions, while exhibiting much slower etch rates along other crystallographic directions. Trenches 502 and 504 are self-aligned between STI structures 110 and LDD portions 406 and 408, respectively. That is to say, in other words, that LDD regions 406 and 408 are virtually non-reactive to the anisotropic etchants POH, EDP, and TMAH. As such, trench 502 is self-aligned to LDD portion 406 at position 514, while trench 504 is self-aligned to LDD portion 408 at position 516.

It can be seen, therefore, that by adjusting the depth of LDD portions 406 and 408, the depth of trenches 502 and 504, respectively, may also be well controlled and deepened by an amount that is substantially equal to the depth of LDD portions 406 and 408, i.e., dimensions 508 and 510, respectively. The diametrically opposing sidewalls of trenches 502 and 504 are similarly self-aligned to STI structures 110 and deepened by an amount that is substantially equal to dimensions 506 and 512, respectively, for the same reasons.

Figure 6A:
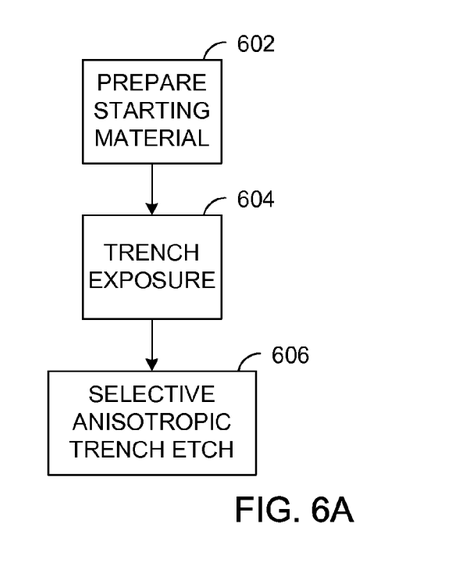
FIG. 6A illustrates an exemplary process flow used to form the semiconductor structure of FIG. 2.

Turning to FIG. 6A, an exemplary process flow is illustrated in which a semiconductor device is constructed in accordance with a first embodiment. In particular, a starting material is formed in step 602, such as discussed above in relation to semiconductor device 100 of FIG. 1. In step 604, the area where trenches 202 and 204 of FIG. 2 are to be formed may be defined by a microlithographic exposure process, whereby photoresist deposited on the top surface of substrate 112 is exposed to geometric patterns of radiation, such as ultraviolet (UV) light, whereby the exposed areas are defined by an exposure tool, photomask, and/or computer data. After exposure, the photoresist is subjected to a development process that converts the latent image in the photoresist into the final image, which serves as the mask in the subsequent etching process to selectively remove material from substrate 112 to produce trenches 202 and 204.

In step 606, the selective anisotropic trench etch is performed using anisotropic silicon etchants that exhibit preferential etching along certain crystallographic directions, while exhibiting much slower etch rates along other crystallographic directions. In one embodiment, POH, EDP, or TMAH etchants are used, which exhibit preferential etching characteristics along the <100> and <110> crystallographic directions. The etch rate along the <111> crystallographic direction, however, that is achieved by the anisotropic etchants POH, EDP, and TMAH, is orders of magnitude slower as compared to the etch rate along the <100> and <110> crystallographic directions.

As such, a trench as exemplified by trench 250 of FIG. 2B may be formed that exhibits the well controlled depth and shape as illustrated. In particular, the etch rate along the <111> crystallographic direction is orders of magnitude slower in relation to the etch rates along the <100> and <110> crystallographic directions. Thus, sidewalls 210 of trench 250 are formed at approximately 54° with respect to the surface of substrate 112 along the <110> crystallographic direction due to the selective etch phenomenon of the etchant along the <111> crystallographic direction. The surface area of floor 212 of trench 250 is time controlled in accordance with the etch rate along the <111> crystallographic direction.

Trenches 202 and 204 are self-aligned between STI structures 110 and sidewall spacers 104 and 102, respectively. That is to say, in other words, that the material forming sidewall spacers 102 and 104 is virtually non-reactive to the anisotropic etchants POH, EDP, and TMAH. As such, trench 202 is self-aligned to sidewall spacer 104 at position 206, while trench 204 is self-aligned to sidewall spacer 102 at position 208. It can be seen, therefore, that by adjusting the width of sidewall spacers 102 and 104, the distances between trenches 204 and 202, respectively, and the channel of semiconductor structure 100 may be well controlled. The diametrically opposing sidewalls of trenches 202 and 204 are similarly self-aligned to STI structures 110 for the same reasons.

Once trenches 202 and 204 are formed, epitaxially grown SiGe, for example, may be formed within trenches 202, 204, to exhibit the same lattice structure as the lattice structure of the underlying Si within well region 108. Since the atom spacing within the SiGe lattice is larger than the atom spacing within the Si lattice, a compressive force is exerted on the channel region immediately below the gate stack. In addition, the compressive stress profile is such that compressive stress is maximized in the channel region at or near the surface of the substrate due to the conical shape of the trenches formed in step 606.

Epitaxially grown SiC, on the other hand, may be formed within trenches 202, 204, to exhibit the same lattice structure as the lattice structure of the underlying Si within well region 108. Since the atom spacing within the SiC lattice is smaller than the atom spacing within the Si lattice, a tensile force is exerted on the channel region immediately below the gate stack. In addition, the tensile stress profile is such that tensile stress is maximized in the channel region at or near the surface of the substrate due to the conical shape of the trenches formed in step 606.

Figure 6B:
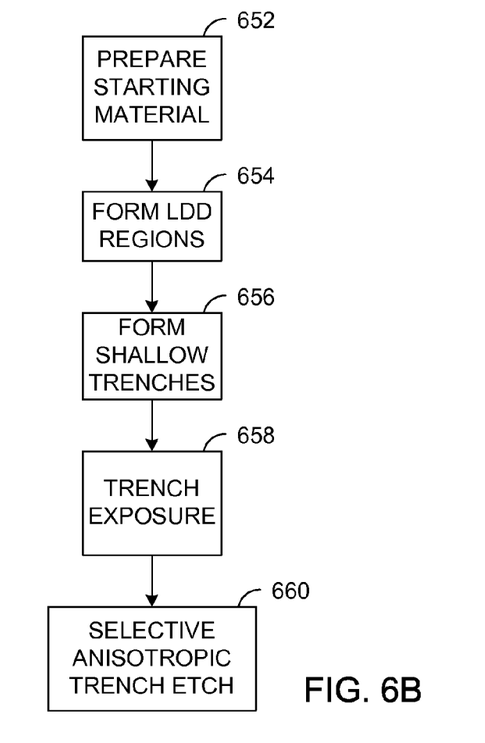
FIG. 6B illustrates an exemplary process flow used to form the semiconductor structure of FIG. 5.

Turning to FIG. 6B, an exemplary process flow is illustrated in which a semiconductor device is constructed in accordance with an alternate embodiment. In particular, a starting material is formed in step 652, such as discussed above in relation to semiconductor device 100 of FIG. 1. In step 654, lightly doped drain (LDD) regions 306 and 308 are formed within trench regions 302 and 304, respectively. In particular, after the gate stack is patterned, LDD regions 306 and 308 are formed by implanting doping atoms using an ion implantation step using, e.g., a medium-current boron implanter, whereby spacers 102 and 104 align the LDD regions to each edge of the gate stack. Next, an anneal step activates the LDD regions and drives the edges of LDD regions 306 and 308 to a proper distance under the gate stack as exemplified in FIG. 3.

In step 656, an additional microlithographic process defines shallow trenches 410 and 412, whereby additional photoresist/exposure/dry etch steps are performed to remove a portion of LDD regions 306 and 308. In particular, shallow trenches 410 and 412 are formed through a dry etch step, so as to remove portions of LDD regions 306 and 308 that exist within the source/drain regions of semiconductor structure 100. The remaining LDD portions 406 and 408 are implemented under the gate stack and are the only remaining LDD portions that exist after the dry etch of step 656 as exemplified in FIG. 4.

Steps 658 and 660 are performed virtually identically to processing steps 604 and 606 as discussed above in relation to FIG. 6A to form trenches 502 and 504. Trenches 502 and 504 are self-aligned between STI structures 110 and LDD portions 406 and 408, respectively. That is to say, in other words, that LDD regions 406 and 408 are virtually non-reactive to the anisotropic etchants POH, EDP, and TMAH. As such, trench 502 is self-aligned to LDD portion 406 at position 514, while trench 504 is self-aligned to LDD portion 408 at position 516. It can be seen, therefore, that by adjusting the depth of LDD portions 406 and 408, the depth of trenches 502 and 504, respectively, may also be well controlled and deepened by an amount that is substantially equal to dimensions 508 and 510, respectively. The diametrically opposing sidewalls of trenches 502 and 504 are similarly self-aligned to STI structures 110 and deepened by an amount that is substantially equal to dimensions 506 and 512, respectively, for the same reasons.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A semiconductor device exhibiting enhanced carrier mobility within a channel region of the semiconductor device, the semiconductor device comprising:
   a gate stack having first and second sidewall spacers, the gate stack being implemented above the channel region of the semiconductor device;
   first and second trenches formed adjacent to the gate stack, each of the first and second trenches having a first portion having a vertical sidewall which is in vertical alignment with a corresponding lightly doped drain region at an outer end of a corresponding side wall spacer, and a second portion below the first portion, the second portion being conically shaped to be wider at a top of each second portion of each trench as compared to a width of each trench below the top of each second portion of each trench, wherein the top of the second portion of the first trench is in vertical alignment with the outer end of the first sidewall spacer and the top of the second portion of the second trench is in vertical alignment with the outer end of the second sidewall spacer;
   strained silicon alloy formed within the first and second trenches; and
   wherein a stress force exerted on the channel region of the semiconductor device is maximized at a surface of the semiconductor device below the gate stack.

2. The semiconductor device of claim 1, wherein the gate stack comprises a metal silicide layer over a gate portion.

3. The semiconductor device of claim 1, further comprising a first shallow trench isolation structure adjacent the first trench and a second shallow trench isolation structure adjacent the second trench.

4. The semiconductor device of claim 3, wherein the first trench is self-aligned to the first shallow trench isolation structure and the second trench is self-aligned to the second shallow trench isolation structure.

5. The semiconductor device of claim 1, wherein a width of the sidewall spacers is selected to establish a distance between the first and second trenches.

6. The semiconductor device of claim 5, wherein the first trench extends between the outer end of the first sidewall spacer and a first shallow trench isolation structure and the second trench extends between the outer end of the second sidewall spacer and a second shallow trench isolation structure.

7. A semiconductor device exhibiting enhanced carrier mobility within a channel region of the semiconductor device, the semiconductor device comprising:
   a gate stack having first and second sidewall spacers, the gate stack being implemented above the channel region of the semiconductor device;
   first and second trenches formed adjacent to the gate stack, a first portion of each of the first and second trenches being conically shaped to be wider at a top of the first portion of each trench as compared to a width of each trench below the top of the first portion of each trench, wherein the top of the first portion of each trench is in vertical alignment with an outer end of a corresponding sidewall spacer;
   first and second lightly doped drain regions under the gate stack, wherein a second portion of the first trench has a first vertical sidewall in vertical alignment with the first lightly doped drain region at the outer end of the first sidewall spacer and a second portion of the second trench has a second vertical sidewall in vertical alignment with the second lightly doped drain region at the outer end of the second sidewall spacer; and
   wherein a stress force exerted on the channel region of the semiconductor device is maximized at a surface of the semiconductor device below the gate stack.

8. The semiconductor device of claim 7, wherein the gate stack comprises a metal silicide layer over a gate portion.

9. The semiconductor device of claim 7, further comprising a first shallow trench isolation structure adjacent the first trench and a second shallow trench isolation structure adjacent the second trench.

10. The semiconductor device of claim 9, wherein the first trench is self-aligned to the first shallow trench isolation structure and the second trench is self-aligned to the second shallow trench isolation structure.

11. The semiconductor device of claim 7, wherein a width of the sidewall spacers is selected to establish a distance between the first and second trenches.

12. The semiconductor device of claim 11, wherein the first trench extends between the outer end of the first sidewall spacer and a first shallow trench isolation structure and the second trench extends between the outer end of the second sidewall spacer and a second shallow trench isolation structure.

13. A semiconductor device exhibiting enhanced carrier mobility within a channel region of the semiconductor device, the semiconductor device comprising:
- a gate stack having first and second sidewall spacers, the gate stack being implemented above the channel region of the semiconductor device; and
- first and second trenches formed adjacent to the gate stack, the first and second trenches each having a first portion extending between a corresponding lightly doped drain region and a shallow trench isolation structure, and each having a second portion which is conically shaped to be wider at a top portion, the first and second portions of the first trench being in vertical alignment with an outer end of the first sidewall spacer and the first and second portions of the second trench being in vertical alignment with an outer end of the second sidewall spacer, the first portion of the first trench and the second trench each having a vertical sidewall which is in vertical alignment with the corresponding sidewall spacer;
- wherein a stress force exerted on the channel region of the semiconductor device is maximized at a surface of the semiconductor device below the gate stack.

14. The semiconductor device of claim 13, wherein a first shallow trench isolation structure is adjacent the first trench and a second shallow trench isolation structure is adjacent the second trench.

15. The semiconductor device of claim 14, wherein the first trench is self-aligned to the first shallow trench isolation structure and the second trench is self-aligned to the second shallow trench isolation structure.

16. The semiconductor device of claim 14, wherein a width of the sidewall spacers is selected to establish the distance between the first and second trenches.

17. The semiconductor device of claim 16, wherein the first trench extends between the outer end of the first sidewall spacer and the first shallow trench isolation structure and the second trench extends between the outer end of the second sidewall spacer and the second shallow trench isolation structure.

18. The semiconductor device of claim 13, wherein the top portion is formed using a slower etch rate than used below the top portion.

* * * * *